United States Patent
Chih et al.

(10) Patent No.: US 12,164,882 B2
(45) Date of Patent: Dec. 10, 2024

(54) IN-MEMORY COMPUTATION CIRCUIT AND METHOD

(71) Applicant: TAIWAN SEMICONDUCTOR MANUFACTURING COMPANY, LTD., Hsinchu (TW)

(72) Inventors: Yu-Der Chih, Hsinchu (TW); Hidehiro Fujiwara, Hsinchu (TW); Yi-Chun Shih, Hsinchu (TW); Po-Hao Lee, Hsinchu (TW); Yen-Huei Chen, Hsinchu (TW); Chia-Fu Lee, Hsinchu (TW); Jonathan Tsung-Yung Chang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 892 days.

(21) Appl. No.: 17/203,130

(22) Filed: Mar. 16, 2021

(65) Prior Publication Data

US 2022/0019407 A1 Jan. 20, 2022

Related U.S. Application Data

(60) Provisional application No. 63/051,497, filed on Jul. 14, 2020.

(51) Int. Cl.
*G06F 7/501* (2006.01)
*G06F 7/53* (2006.01)
(Continued)

(52) U.S. Cl.
CPC ............ *G06F 7/501* (2013.01); *G06F 7/5318* (2013.01); *G11C 7/1012* (2013.01); *G11C 7/1036* (2013.01); *G11C 11/4074* (2013.01)

(58) Field of Classification Search
CPC ...... G06F 7/501; G06F 7/5318; G06F 7/5433; G11C 7/1012; G11C 7/1036; G11C 7/1006; G11C 11/4074; G11C 8/12
(Continued)

(56) References Cited

U.S. PATENT DOCUMENTS

2019/0065151 A1* 2/2019 Chen .................. G06F 17/16
2019/0196788 A1   6/2019 Han et al.

FOREIGN PATENT DOCUMENTS

TW   202016803   5/2020
TW   202024960   7/2020
TW   I698884     7/2020

OTHER PUBLICATIONS

Office Action dated Apr. 11, 2022 for corresponding case No. TW 11120350940. (pp. 1-4).

* cited by examiner

*Primary Examiner* — Tan V Mai
(74) *Attorney, Agent, or Firm* — Hauptman Ham, LLP

(57) ABSTRACT

A memory circuit includes a selection circuit, a column of memory cells, and an adder tree. The selection circuit is configured to receive input data elements, each input data element including a number of bits equal to H, and output a selected set of kth bits of the H bits of the input data elements. Each memory cell of the column of memory cells includes a first storage unit configured to store a first weight data element and a first multiplier configured to generate a first product data element based on the first weight data element and a first kth bit of the selected set of kth bits. The adder tree is configured to generate a summation data element based on each of the first product data elements.

20 Claims, 9 Drawing Sheets

(51) Int. Cl.
*G11C 7/10* (2006.01)
*G11C 11/4074* (2006.01)

(58) Field of Classification Search
USPC .......................................................... 708/607
See application file for complete search history.

IN-MEMORY COMPUTATION CIRCUIT AND METHOD

PRIORITY CLAIM

The present application claims the priority of U.S. Provisional Application No. 63/051,497, filed Jul. 14, 2020, which is incorporated herein by reference in its entirety.

BACKGROUND

Memory arrays are often used to store and access data used for various types of computations such as logic or mathematical operations. To perform these operations, data bits are moved between the memory arrays and circuits used to perform the computations. In some cases, computations include multiple layers of operations, and the results of a first operation are used as input data in a second operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
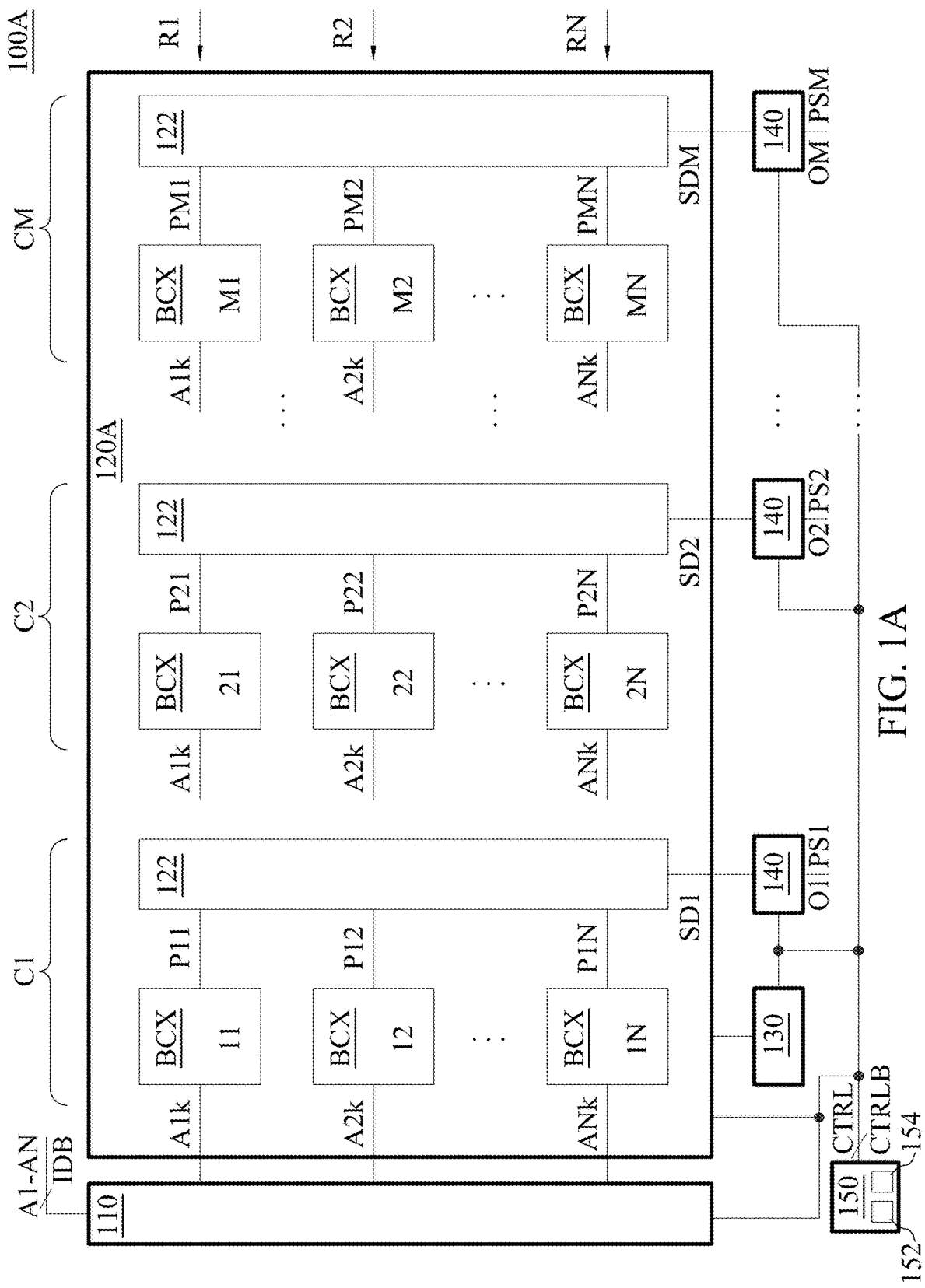
FIGS. 1A and 1B are diagrams of memory circuits, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a memory array of a memory circuit includes both memory storage and mathematic operation units and is thereby configured to perform an in-memory computation whereby a partial sum is generated based on input data elements and stored weight data elements. Compared to approaches in which memory arrays do not include elements configured to perform in-memory computations, such memory circuits are capable of generating partial sums using smaller areas and lower power levels. In various applications, e.g., convolutional neural network (CNN) applications, the memory circuits enable arrays of stored weight data elements to be efficiently applied in multiply and accumulate (MAC) operations to one or more sets of input data elements.

Figure 1B:
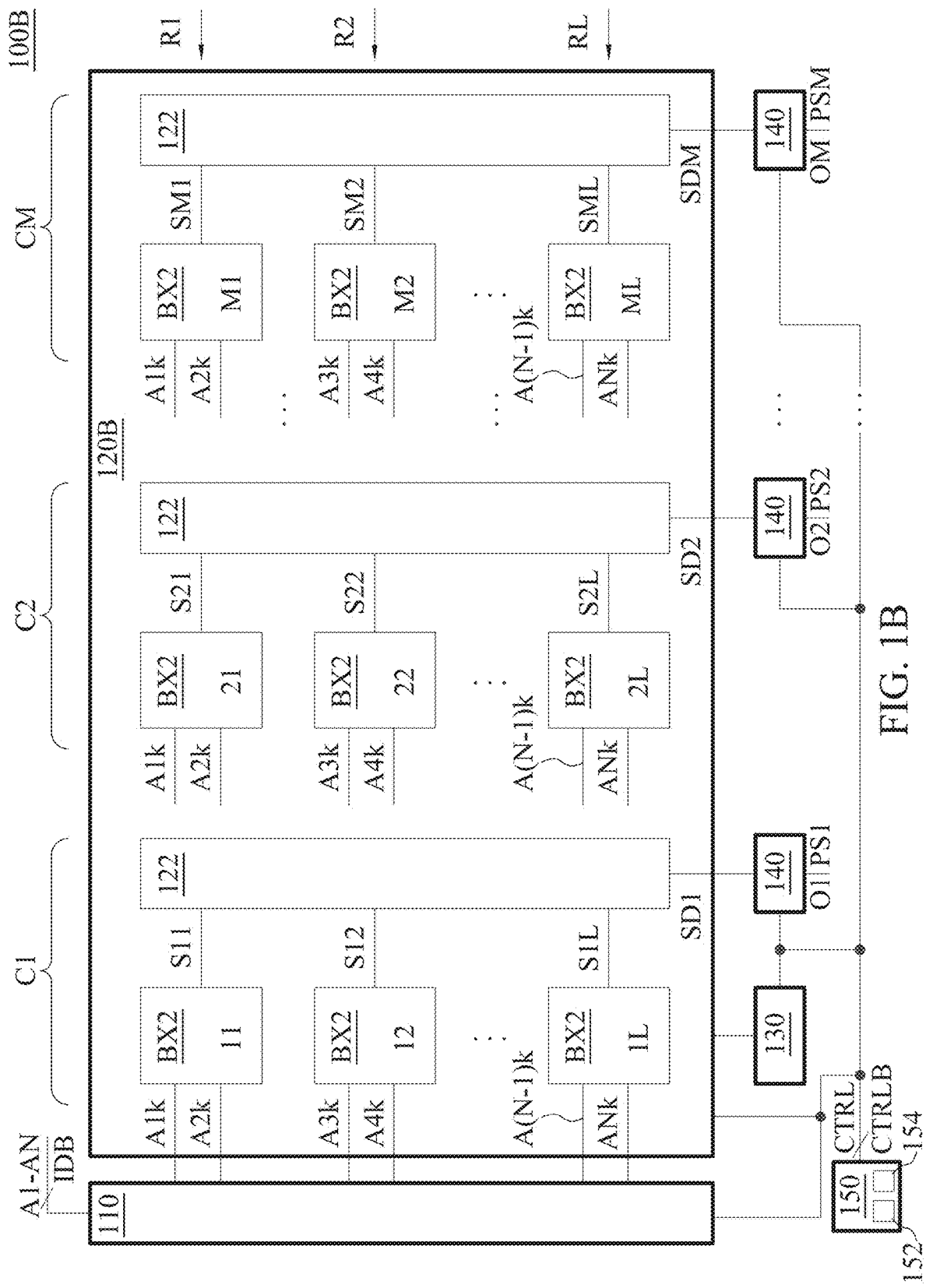

FIGS. 1A and 1B are diagrams of respective memory circuits 100A and 100B, in accordance with some embodiments. Each memory circuit 100A and 100B includes a selection circuit 110 coupled to an input data bus IDB and to a corresponding memory array 120A or 120B, an input/output (I/O) circuit 130 and a number M of accumulators 140 coupled to the corresponding memory array 120A or 120B, and a control circuit 150 coupled to each of selection circuit 110, the corresponding memory array 120A or 120B, I/O circuit 130, and each accumulator 140 through a control signal bus CTRLB.

Each memory array 120A and 120B includes M columns C1-CM corresponding to the M accumulators 140. Memory array 120A includes a number N rows of memory cells BCX, each including a single input terminal (not labeled) and a single output terminal (not labeled), each input terminal thereby corresponding to one of N rows of data of memory array 120A. Memory array 120B includes N/2 rows of memory cells BX2, each including two input terminals (not labeled) and a single output terminal (not labeled), each input terminal thereby corresponding to one of N rows of data of memory array 120B. As discussed below, each memory circuit 100A and 100B is thereby configured to receive a plurality of N input data elements A1-AN on input data bus IDB, each input data element A1-AN including a number of bits equal to H.

Table 1 depicts a data structure of input data elements A1-AN in which each of the N input data elements A1-AN includes H bits of data.

TABLE 1

| Data Element | Bit 1 | Bit 2 | . . . | Bit H |
|---|---|---|---|---|
| A1 | A11 | A12 | . . . | A1H |
| A2 | A21 | A22 | . . . | A2H |
| . | . | . | . | . |
| . | . | . | . | . |

TABLE 1-continued

| Data Element | Bit 1 | Bit 2 | ... | Bit H |
|---|---|---|---|---|
| . | . | . | . | . |
| . | . | . | . | . |
| . | . | . | . | . |
| AN | AN1 | AN2 | ... | ANH |

As discussed below, memory circuits 100A and 100B are configured such that, in operation, each column C1-CM of each memory array 120A and 120B simultaneously receives a same-numbered bit (kth bit) of each input data element A1-AN, i.e., a set of bits A1k-ANk, from selection circuit 110. Each column performs a mathematical operation based on the received set of bits A1k-ANk and weight data elements stored in corresponding memory cells BCX or BX2, thereby generating the number M summation data elements SD1-SDM corresponding to columns C1-CM.

A counter k is cycled through each of the H bits, e.g., from 1 to H, such that selection circuit 110 outputs sets of bits A1k-ANk in a sequentially selected manner, and each column repeats the mathematical operation on the selected set of bits A1k-ANk for each value of counter k, thereby generating a sequence of H summation data elements SD1-SDM. Accumulators 140 are configured to generate corresponding partial sums PS1-PSM based on the sequence of summation data elements SD1-SDM, and output the partial sums PS1-PSM on corresponding output ports O1-OM.

In the embodiment depicted in FIG. 1A, memory array 120A includes memory cells BCX configured to each receive one bit of the sequentially selected sets of kth bits of input data elements A1-AN, and in the embodiment depicted in FIG. 1B, memory array 120B includes memory cells BX2 configured to each receive two bits of adjacent data elements of the sequentially selected sets of kth bits of input data elements A1-AN. Each memory circuit 100A and 100B is thereby configured to be capable of executing some or all of a method, e.g., one or both of methods 900 or 1000 discussed below with respect to FIGS. 9 and 10, by which an in-memory computation is performed.

In various embodiments, a memory circuit 100A or 100B is included in a neural network, e.g., a CNN, a sensor, e.g., a magnetic, image, vibration, or gyro sensor, a radio-frequency (RF) device, or other integrated circuit (IC) device.

Each memory circuit 100A and 100B is simplified for the purpose of illustration. In various embodiments, one or both of memory circuits 100A or 100B includes various elements in addition to those depicted in FIGS. 1A and 1B or is otherwise arranged so as to perform the operations discussed below.

Two or more circuit elements are considered to be coupled based on one or more direct signal connections and/or one or more indirect signal connections that include one or more logic devices, e.g., an inverter or logic gate, between the two or more circuit elements. In some embodiments, signal communications between the two or more coupled circuit elements are capable of being modified, e.g., inverted or made conditional, by the one or more logic devices.

Selection circuit 110 is an electronic circuit including one or more data registers (not shown in FIGS. 1A and 1B) coupled to input data bus IDB, and one or more multiplexers or similar circuits (not shown in FIGS. 1A and 1B) coupled to the one or more data registers and to control signal bus CTRLB.

A data register, also referred to as a buffer in some embodiments, is an electronic circuit configured to temporarily store some or all of one or more data elements, e.g., the H bits of each input data element A1-AN. In various embodiments, a data register includes a single set of terminals configured to input and output data bits, or separate sets of terminals configured to input and output data bits.

A multiplexer is an electronic circuit including a first set of terminals configured to receive a plurality of signals, e.g., the H bits of one of input data elements A1-AN, one or more switching devices, e.g., transistors, configured to receive one or more control signals, e.g., control signals CTRL, and at least one terminal configured to output a selected one of the received signals responsive to the one or more control signals.

Selection circuit 110 is thereby configured to store the H bits of each input data element A1-AN received on input data bus IDB, and responsive to one or more control signals CTRL received on control signal bus CTRLB, output a set of selected kth bits A1k-ANk to the corresponding one of memory arrays 120A or 120B. For each input data element A1-AN, the corresponding selected kth bit A1k-ANk is a same kth bit of the total H bits. In some embodiments, selection circuit 110 includes a selection circuit 200 discussed below with respect to FIG. 2.

In some embodiments, selection circuit 110 is configured to receive the number N of input data elements A1-AN ranging from 4 to 512. In some embodiments, selection circuit 110 is configured to receive the number N of input data elements A1-AN ranging from 32 to 128.

In some embodiments, selection circuit 110 is configured to receive the number H of bits of each input data element A1-AN ranging from 1 to 16. In some embodiments, selection circuit 110 is configured to receive the number H of bits of each input data element A1-AN ranging from 4 to 8.

In various embodiments, the one or more control signals CTRL are configured to, in operation, cause selection circuit 110 to sequentially output the sets of kth bits A1k-ANk from a least significant bit (LSB) to a most significant bit (MSB), or from an MSB to an LSB. In various embodiments, the one or more control signals CTRL are configured to cause selection circuit 110 to sequentially output an entirety of the number H of sets of bits or a subset of the number H of sets of bits. In some embodiments, each input data element A1-AN includes a number of bits fewer than H bits, and the one or more control signals CTRL are configured to cause selection circuit 110 to sequentially output an entirety or a subset of the number of sets of received bits.

In various embodiments, the one or more control signals CTRL are configured to cause selection circuit 110 to, for each value of counter k, output an entirety or a subset of the corresponding selected set of kth bits A1k-ANk. In some embodiments, a plurality of input data elements includes a number of data elements fewer than N, and the one or more control signals CTRL are configured to, for each value of counter k, cause selection circuit 110 to output an entirety or a subset of the corresponding set of kth bits A1k-ANk of the number of received data elements.

Each memory array 120A and 120B is an electronic circuit including M columns C1-CM, each column C1-CM including an adder tree 122, discussed below, and corresponding memory cells BCX or BX2 coupled to the adder tree 122. The memory cells BCX or BX2 of each column C1-CM are further coupled to selection circuit 110 and are thereby configured so that, in operation, each column C1-CM simultaneously receives the selected set of kth bits A1k-ANk output from selection circuit 110 based on counter k.

Because each memory cell BCX is configured to receive the bits of a single data element A1-AN, memory array 120A includes a total of N rows R1-RN of memory cells BCX such that each row R1-RN corresponds to a row of data of memory array 120A. Because each memory cell BX2 is configured to receive the bits of two data elements A1-AN, memory array 120B includes a total of L rows R1-RL of memory cells BX2, the number L being equal to N/2, such that each row R1-RL corresponds to two rows of data of memory array 120B. In the embodiments depicted in FIGS. 1A and 1B, each instance of a memory cell BCX or BX2 includes a position indicator, e.g., 21, corresponding to the column and row in which the given instance is located.

In some embodiments, memory array 120A or 120B includes the number M of columns C1-CM ranging from 2 to 512. In some embodiments, memory array 120A or 120B includes the number M of columns C1-CM ranging from 16 to 128.

In the embodiments depicted in FIGS. 1A and 1B, each memory array 120A and 120B includes a single array layer of rows R1-RN or R1-RL and columns C1-CM. In some embodiments, one or both of memory arrays 120A or 120B includes one or more array layers (not shown) in addition to the single layer depicted in FIGS. 1A and 1B, thereby including rows and columns in addition to those of a single layer.

A memory cell BCX includes a storage element coupled to a multiplier (not shown in FIGS. 1A and 1B). A storage element is an electrical, electromechanical, electromagnetic, or other device configured to store one or more data bits represented by logical states. In some embodiments, a logical state corresponds to a voltage level of an electrical charge stored in a portion or all of a storage element. In some embodiments, a logical state corresponds to a physical property, e.g., a resistance or magnetic orientation, of a portion or all of a storage element.

In some embodiments, the storage element includes one or more static random-access memory (SRAM) cells. In various embodiments, an SRAM cell, e.g., a five-transistor (5T), six-transistor (6T), eight-transistor (8T), or nine-transistor (9T) SRAM cell, includes a number of transistors ranging from two to twelve. In some embodiments, an SRAM cell includes a multi-track SRAM cell. In some embodiments, an SRAM cell includes a length at least two times greater than a width.

In some embodiments, the storage element includes one or more dynamic random-access memory (DRAM) cells, resistive random-access memory (RRAM) cells, magnetoresistive random-access memory (MRAM) cells, ferroelectric random-access memory (FeRAM) cells, NOR flash cells, NAND flash cells, conductive-bridging random-access memory (CBRAM) cells, data registers, non-volatile memory (NVM) cells, 3D NVM cells, or other memory cell types capable of storing bit data.

In some embodiments, the storage element is configured to store a number of data bits ranging from 1 to 16. In some embodiments, the storage element is configured to store a number of data bits ranging from 4 to 8.

The storage element includes one or more I/O connections (not shown) through which the logical states are programmed in write operations and accessed in read operations, e.g., a multiplication operation.

A multiplier is an electronic circuit including one or more logic gates configured to perform a mathematical operation, e.g., multiplication, based on a received data bit, e.g., one of selected kth bits A1$k$-ANk, and a received data element, e.g., a multi-bit weight data element stored in the storage element, thereby generating a product data element equal to the product of the input data bit and the input data element. In some embodiments, the multiplier is configured to generate the product data element including a number of bits equal to the number of bits of the received data element. In various embodiments, the multiplier includes one or more AND or NOR gates or other circuits suitable for performing some or all of a multiplication operation.

By including the storage element coupled to the multiplier and configured to store a weight data element, and the multiplier coupled to selection circuit 110 and configured to receive one bit of the selected set of kth bits A1$k$-ANk, each memory cell BCX is configured to generate a product data element P11-PMN based on the one bit of the selected set of kth bits A1$k$-ANk and the weight data element corresponding to the position of the given memory cell BCX within memory array 120A. In some embodiments, a memory cell BCX includes a memory cell 300A discussed below with respect to FIG. 3A.

A memory cell BX2 includes a first storage element coupled to a first multiplier, a second storage element coupled to a second multiplier, and an adder coupled to the first and second multipliers (not shown in FIGS. 1A and 1B). The first storage element and multiplier are configured to generate a first product data element as discussed above with respect to memory cell BCX, and the second storage element and multiplier are configured to generate a second product data element as discussed above with respect to memory cell BCX.

An adder is an electronic circuit including one or more logic gates configured to perform a mathematical operation, e.g., addition, based on received first and second data elements, e.g., first and second product data elements generated by the first and second multipliers, thereby generating a sum data element equal to the sum of the received first and second data elements. In some embodiments, the adder is configured to generate the sum data element including a number of bits one greater than the number of bits of each of the received first and second data elements. In various embodiments, the adder includes one or more full adder gates, half adder gates, ripple-carry adder circuits, carry-save adder circuits, carry-select adder circuits, carry-look-ahead adder circuits, or other circuits suitable for performing some or all of an addition operation.

By including the first multiplier configured to generate the first product data element based on a first bit of the selected set of kth bits A1$k$-ANk and first stored weight data element, the second multiplier configured to generate the second product data element based on a second bit of the selected set of kth bits A1$k$-ANk, and an adder coupled to each of the first and second multipliers, each memory cell BX2 is configured to generate a sum data element S11-SML based on the first and second bits of the selected set of kth bits A1$k$-ANk and first and second weight data elements corresponding to the position of the given memory cell BX2 within memory array 120B. In some embodiments, a memory cell BX2 includes a memory cell 300B discussed below with respect to FIG. 3B.

Adder tree 122 is an electronic circuit including multiple layers of adders (not shown in FIGS. 1A and 1B) in which a first layer is configured to receive a plurality of data elements, e.g., product data elements P11-PMN or sum data elements S11-SML, and a last layer includes a single adder configured to generate a data element, e.g., a summation data element SD1-SDM, based on the received plurality of data elements. In some embodiments, each of one or more successive layers between the first and last layers is configured to receive a first number of sum data elements generated by a preceding layer, and generate a second number of sum data elements based on the first number of sum data elements, the second number being half the first number. Thus, a total number of layers includes the first and last layers and each successive layer, if present. In some embodiments, an adder tree 122 includes an adder tree 400 discussed below with respect to FIG. 4.

Adder tree 122 is thereby configured to receive the plurality of data elements having a number equal to two raised to a power equal to the total number of layers, the number of data elements thereby being a binary exponent of the total number of layers. In the embodiment depicted in FIG. 1A, memory array 120A includes each instance of adder tree 122 including the total number of layers such that two raised to the total number of layers is equal to N product data elements, e.g., P11-P1N. In the embodiment depicted in FIG. 1B, memory array 120B includes each instance of adder tree 122 including the total number of layers such that two raised to the total number of layers is equal to L sum data elements, e.g., S11-S1L.

In some embodiments, adder tree 122 includes the total number of layers ranging from 2 to 9. In some embodiments, adder tree 122 includes the total number of layers ranging from 4 to 7.

In some embodiments, each adder in each layer of adder tree 122 is configured to generate the corresponding sum data element including a number of bits one greater than the number of bits of the sum data element of the preceding layer or, in the case of the first layer, the data element of the received plurality of data elements.

In some embodiments depicted in FIG. 1A, adder trees 122 include the first layer configured to receive product data elements P11-PMN including a first number of bits equal to the number of bits of the weight data elements stored in each memory cell BCX, and the last layer configured to generate summation data elements SD1-SDM including a second number of bits equal to the first number of bits plus a value equal to the total number of layers in adder trees 122.

In some embodiments depicted in FIG. 1B, adder trees 122 include the first layer configured to receive sum data elements S11-SML including a first number of bits one greater than the number of bits of the weight data elements stored in each memory cell BX2, and the last layer configured to generate summation data elements SD1-SDM including a second number of bits equal to the first number of bits plus a value equal to the total number of layers in adder trees 122.

I/O circuit 130 is an electronic circuit coupled to control signal bus CTRLB and to the one or more I/O connections of each storage element of each memory cell BCX of memory array 120A or each memory cell BX2 of memory array 120B through one or more word lines, one or more bit lines, and/or one or more data lines (not shown). I/O circuit 130 is thereby configured to, responsive to one or more control signals CTRL received on control signal bus CTRLB, program each memory cell BCX or BX2 to one or more logical states in write operations and to cause one or more logical states stored in each memory cell BCX or BX2 to be accessed in read operations.

Accumulator 140 is an electronic circuit coupled to control signal bus CTRLB and including one or more adders, one or more data registers, and one or more shifters (not shown in FIGS. 1A and 1B) collectively coupled in a feedback arrangement. The one or more adders are coupled to adder tree 122 and are thereby configured to receive one of summation data elements SD1-SDM, each summation data element SD1-SDM being one of the sequence of H summation data elements SD1-SDM corresponding to the sequentially selected set of kth bits A1k-ANk output from selection circuit 110 based on counter k.

The one or more adders are further configured to receive a shifted data element output from the one or more shifters, and generate an internal sum data element based on the shifted data element and the one of summation data elements SD1-SDM. The one or more data registers are configured to receive the internal sum data element from the one or more adders, store the internal sum data element, and output the stored internal sum data element to the one or more shifters and to a corresponding one of output ports O1-OM. The one or more shifters are configured to receive the stored internal data element output from the one or more data registers, and generate the shifted data element by shifting the stored internal data element by one bit in either an MSB direction or an LSB direction.

Accumulator 140 is thereby configured to, responsive to one or more control signals CTRL received on control signal bus CTRLB, perform an accumulation operation whereby the stored internal sum data element is increased as each one in the sequence of summation data elements SD1-SDM is received. The one or more control signals CTRL are based on and/or include counter k information, and are thereby configured to cause the accumulation operation to be coordinated with the sequential selection of the sets of kth bits A1k-ANk such that the stored internal data element is shifted and added to the received summation data element SD1-SDM synchronized with the timing and MSB/LSB direction of the sequential generation of the sets of kth bits A1k-ANk.

In operation, execution of the accumulation operation based on cycling counter k over the span of H bits of the sets of kth bits A1k-ANk and the corresponding H instances of the summation data element SD1-SDM causes the internal data element stored in the one or more data registers to be output on the corresponding output port O1-OM as the corresponding one of partial sums PS1-PSM.

Control circuit 150 is an electronic circuit configured to control operation of memory circuit 100A or 100B by generating control signals CTRL and outputting control signals CTRL on control signal bus CTRLB. In operation, control signals CTRL are received from control signal bus CTRLB by selection circuit 110, memory array 120A or 120B, I/O circuit 130, and accumulators 140 in accordance with the embodiments discussed above and below. In some embodiments, control circuit 150 is configured to generate control signals CTRL including and/or based on one or more clock signals.

In various embodiments, control circuit 150 includes a hardware processor 152 and a non-transitory, computer-readable storage medium 154. Computer-readable storage medium 154, amongst other things, is encoded with, i.e., stores, computer program code, i.e., a set of executable instructions. Execution of the instructions by hardware processor 152 represents (at least in part) a memory circuit operation tool which implements a portion or all of, e.g., method 900 discussed below with respect to FIG. 9 and/or method 1000 discussed below with respect to FIG. 10 (hereinafter, the noted processes and/or methods).

In various embodiments, processor 152 is electrically coupled to computer-readable storage medium 154 via an I/O interface, and to a network via a bus (details not shown). The network interface is connected to a network (not shown) so that processor 152 and computer-readable storage medium 154 are capable of connecting to external elements via the network. Processor 152 is configured to execute the computer program code encoded in computer-readable storage medium 154 in order to cause control circuit 150 and memory circuit 100A or 100B to be usable for performing a portion or all of the noted processes and/or methods. In one or more embodiments, processor 152 is a central processing unit (CPU), a multi-processor, a distributed processing system, an application specific integrated circuit (ASIC), and/or a suitable processing unit.

In one or more embodiments, computer-readable storage medium 154 is an electronic, magnetic, optical, electromagnetic, infrared, and/or a semiconductor system (or apparatus or device). For example, computer-readable storage medium 154 includes a semiconductor or solid-state memory, a magnetic tape, a removable computer diskette, a RAM, an SRAM, a DRAM, a read-only memory (ROM), a rigid magnetic disk, and/or an optical disk. In one or more embodiments using optical disks, computer-readable storage medium 154 includes a compact disk-read only memory (CD-ROM), a compact disk-read/write (CD-R/W), and/or a digital video disc (DVD).

In one or more embodiments, computer-readable storage medium 154 stores the computer program code configured to cause control circuit 150 to generate the control signals so as to be usable for performing a portion or all of the noted processes and/or methods. In one or more embodiments, computer-readable storage medium 154 also stores information which facilitates performing a portion or all of the noted processes and/or methods.

By the configuration discussed above, each memory circuit 100A and 100B is capable of, in operation, receiving input data elements A1-AN on input data bus IDB, sequentially selecting sets of kth bits A1k-ANk using selection circuit 110, receiving the sequence of selected sets of bits A1k-ANk at each column C1-CM of memory cells BCX or BX2, and using memory cells BCX or BX2 and corresponding adder trees 122 to perform a synchronized series of mathematical operations whereby partial sums PS1-PSM are output on output ports O1-OM. By including memory array 120A or 120B, respective memory circuit 100A or 100B is configured to perform an in-memory computation whereby at least one partial sum PS1-PSM is generated based on input data elements A1-AN and stored weight data elements. Compared to approaches in which memory arrays do not include elements configured to perform in-memory computations, such memory circuits are capable of generating partial sums using smaller areas and lower power levels.

Figure 2:
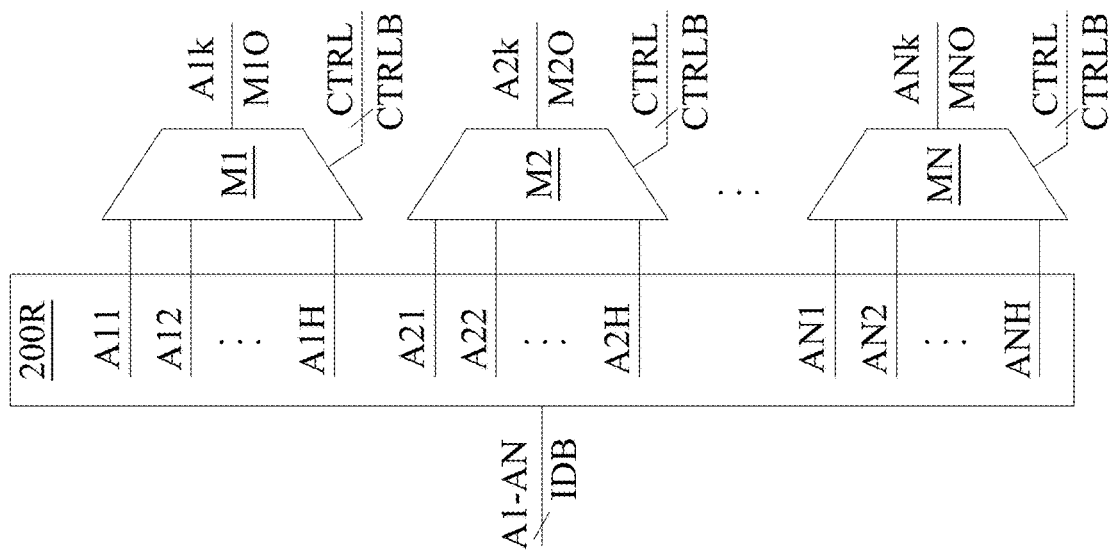
FIG. 2 is a diagram of a selection circuit, in accordance with some embodiments.

FIG. 2 is a diagram of selection circuit 200, in accordance with some embodiments. Selection circuit 200, also referred to as multiplexing circuit 200 in some embodiments, is usable as selection circuit 110 discussed above with respect to FIGS. 1A and 1B. Selection circuit 200 includes a data register 200R coupled to input data bus IDB, and a plurality of N multiplexers M1-MN coupled to data register 200R and to control signal bus CTRLB.

Data register 200R includes a first set of terminals (not shown) coupled to input data bus IDB and is thereby configured to receive bit data including the H bits of each input data element A1-AN, and temporarily store the bit data. In various embodiments, data register 200R is configured to, in operation, receive the bit data in parallel or in series. Data register 200R includes a second set of terminals (not labeled) coupled to multiplexers M1-MN and is thereby configured to, in operation, output each of the H bits of each input data element A1-AN, depicted in FIG. 2 as A11-A1H, A21-A2H, . . . AN1-ANH, to multiplexers M1-MN.

Multiplexers M1-MN correspond to input data elements A1-AN such that each multiplexer M1-MN includes a set of terminals (not labeled) configured to receive the H bits of the corresponding data element A1-AN. Each multiplexer M1-MN includes a corresponding output terminal M1O-MNO and is thereby configured to, in operation, output a selected kth bit A1k-ANk of the corresponding data element A1-AN on the corresponding output terminal M1O-MNO responsive to one or more control signals CTRL received on control signal bus CTRLB. Multiplexers M1-MN and the one or more control signals CTRL are configured to, in operation, simultaneously output the same kth bit of each data element A1-AN, thereby generating the set of kth bits A1k-ANk based on counter k as discussed above.

Selection circuit 200 is thereby configured to be capable of performing the operations discussed above with respect to selection circuit 110 and FIGS. 1A and 1B. By including selection circuit 200 as selection circuit 110, each memory circuit 100A and 100B is capable of realizing the benefits discussed above.

Figure 3A:
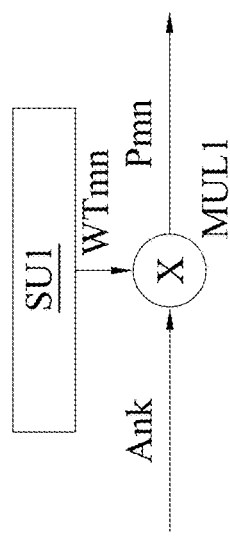
FIGS. 3A and 3B are diagrams of memory cells, in accordance with some embodiments.
Figure 3B:
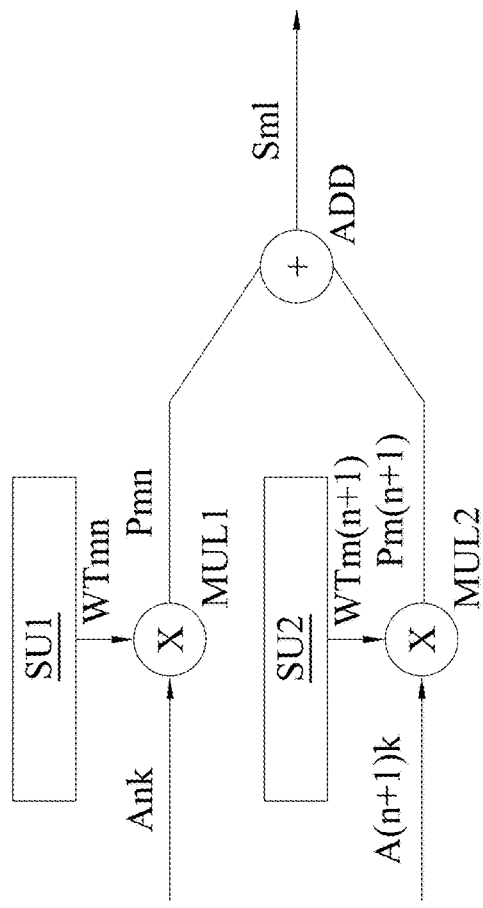

FIGS. 3A and 3B are diagrams of respective memory cells 300A and 300B, in accordance with some embodiments. Memory cell 300A, also referred to as a bit cell 300A in some embodiments, is usable as one or more instances of memory cell BCX discussed above with respect to FIG. 1A, and memory cell 300B, also referred to as a bit cell 300B in some embodiments, is usable as one or more instances of memory cell BX2 discussed above with respect to FIG. 1B.

Each memory cell 300A and 300B is simplified for the purpose of illustration. In various embodiments, one or both of memory cells 300A or 300B includes various elements in addition to those depicted in FIGS. 3A and 3B or is otherwise arranged so as to perform the operations discussed below. In various embodiments, a memory cell 300A or 300B includes a plurality of electrical connections to one or more word lines, one or more bit lines, and/or one or more data lines (not shown), and thereby to I/O circuit 130, discussed above with respect to FIGS. 1A and 1B, through which weight data elements WTmn and WTm(n+1), discussed below, are stored and/or accessed.

Each memory cell 300A and 300B includes a storage unit SU1 coupled to a multiplier MUL1. Memory cell 300B also includes a storage unit SU2 coupled to a multiplier MUL2, and an adder ADD coupled to each of multipliers MUL1 and MUL2.

Storage unit SU1 is configured to store weight data element WTmn, and storage unit SU2 is configured to store weight data element WTm(n+1). In some embodiments, indicator m corresponds to one of the number M of columns C1-CM, and indicator n corresponds to one of the number N of rows of data of memory array 120A or 120B.

In various embodiments, each storage unit SU1 and SU2 is configured to store respective weight data element WTmn or WTm(n+1) including a single bit or multiple bits. In some embodiments, one or both of storage units SU1 or SU2 is configured to store the corresponding weight data element WTmn or WTm(n+1) including a number of bits ranging from 1 to 16. In some embodiments, one or both of storage units SU1 or SU2 is configured to store the corresponding weight data element WTmn or WTm(n+1) including the number of bits ranging from 4 to 8. In some embodiments, one or both of storage units SU1 or SU2 is configured to store the corresponding weight data element WTmn or WTm(n+1) including a programmable number of bits.

Each multiplier MUL1 and MUL2 is configured to perform a multiplication operation including a number of bits equal to that of the corresponding storage unit SU1 or SU2 to which the given multiplier MUL1 or MUL2 is coupled. Multiplier MUL1 is configured to receive weight data element WTmn from storage unit SU1 and a first one of the kth bits A1k-ANk, represented in FIGS. 3A and 3B as Ank, and output the product as a product data element Pmn.

In some embodiments, e.g., those in which memory cell 300A is used as memory cell BCX, product data element Pmn, based on indicators m and n, corresponds to one of product data elements P11-PMN discussed above with respect to FIG. 1A. Memory cell 300A is thereby configured to be capable of performing the operations discussed above with respect to memory cell BCX and FIG. 1A.

Multiplier MUL2 is configured to receive weight data element WTm(n+1) from storage unit SU2 and a second one of the kth bits A1k-ANk, represented in FIG. 3B as A(n+1)k, and output the product as a product data element Pm(n+1).

Adder ADD is configured to receive each product data element Pmn and Pm(n+1) having the number of bits of the corresponding multiplier MUL1 or MUL2, perform an addition operation, and output the sum as a sum data element Sml having a number of bits one greater than the number of bits of each product data element Pmn and Pm(n+1). In some embodiments, indicator l corresponds to one of the number L of rows of memory cells BX2 of memory array 120B.

In some embodiments, e.g., those in which memory cell 300B is used as memory cell BX2, sum data element Sml, based on indicators m and l, corresponds to one of sum data elements S11-SML discussed above with respect to FIG. 1B. Memory cell 300B is thereby configured to be capable of performing the operations discussed above with respect to memory cell BX2 and FIG. 1B.

By including memory cell 300A as one or more instances of memory cell BCX or including memory cell 300B as one or more instances of memory cell BX2, the corresponding memory circuit 100A or 100B is capable of realizing the benefits discussed above.

Figure 4:
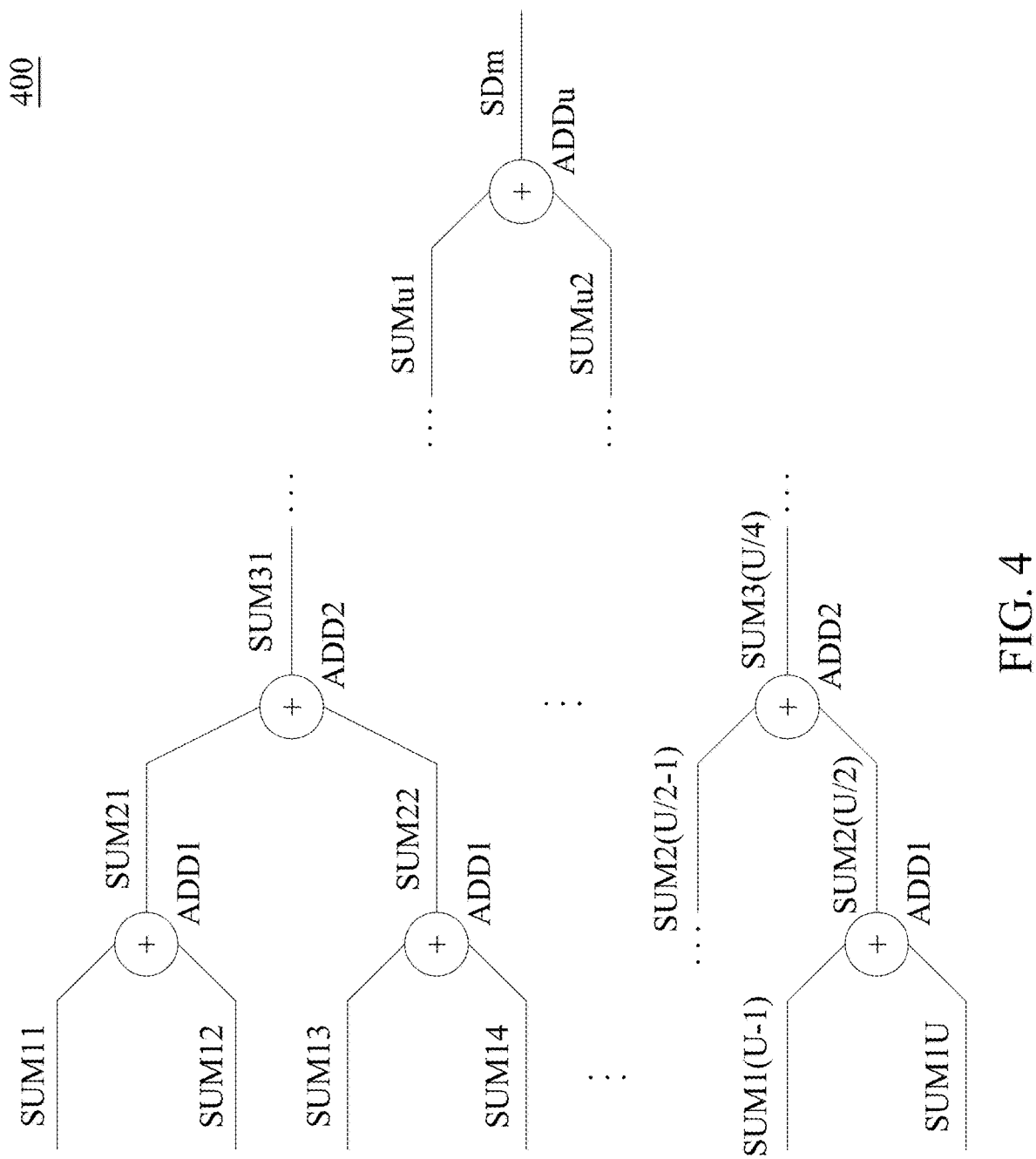
FIG. 4 is a diagram of an adder tree, in accordance with some embodiments.

FIG. 4 is a diagram of adder tree 400, in accordance with some embodiments. Adder tree 400 is usable as adder tree 122 discussed above with respect to FIGS. 1A and 1B. Adder tree 400 includes a number u of layers of adders ADD1-ADDu.

A first layer of adders includes adders ADD1 configured to receive a number U (=$2^u$) of sum data elements SUM11-SUM1U, the first layer thereby including a number U/2 of adders ADD1. In some embodiments, e.g., those in which adder tree 400 is used as adder tree 122 in a column C1-CM of memory array 120A, sum data elements SUM11-SUM1U correspond to a plurality of product data elements output by the corresponding column of memory cells BCX, e.g., product data elements P11-P1N output by column C1, discussed above with respect to FIG. 1A. In some embodiments, e.g., those in which adder tree 400 is used as adder tree 122 in a column C1-CM of memory array 120B, sum data elements SUM11-SUM1U correspond to a plurality of sum data elements output by the corresponding column of memory cells BX2, e.g., sum data elements S11-S1L output by column C1, discussed above with respect to FIG. 1B.

Each adder ADD1 is configured to perform an addition operation on a corresponding received pair of sum data elements, e.g., SUM11 and SUM12, of sum data elements SUM11-SUM1U, and output the sum as a corresponding one of sum data elements SUM21-SUM2(U/2). Adders ADD1 are configured to receive sum data elements SUM11-SUM1U including a first number of bits, e.g., the number of bits of product data elements P11-PMN discussed above with respect to FIG. 1A or of sum data elements S11-SML discussed above with respect to FIG. 1B, and output sum data elements SUM21-SUM2(U/2) including a second number of bits one greater than the first number of bits.

A second layer of adders includes a number U/4 of adders ADD2. Each adder ADD2 is configured to perform an addition operation on a corresponding received pair of sum data elements, e.g., SUM21 and SUM22, of sum data elements SUM21-SUM2(U/2), and output the sum as a corresponding one of sum data elements SUM31-SUM3(U/4). Adders ADD2 are configured to receive sum data elements SUM21-SUM2(U/2) including the second number of bits and output sum data elements SUM31-SUM3(U/4) including a third number of bits one greater than the second number of bits.

A last layer of adders includes the single adder ADDu configured to perform an addition operation on a pair of sum data elements SUMu1 and SUMu2 received from a preceding layer of adders, and output the sum as summation data element SDm. Adder ADDu is configured to receive sum data elements SUMu1 and SUMu2 including a fourth number of bits and output summation data element SDm including a fifth number of bits one greater than the fourth number of bits and equal to the first number of bits plus the number u. In some embodiments, e.g., those in which adder tree 400 is used as adder tree 122, summation data element SDm corresponds to one of summation data elements SD1-SDM discussed above with respect to FIGS. 1A and 1B.

In various embodiments, adder tree 400 includes one or more additional layers of adders between the second and last layers depicted in FIG. 4, each additional layer being configured consistently with the configurations of the first, second, and last layers discussed above such that, in operation, summation data element SDm is generated based on received sum data elements SUM11-SUM1U. In some embodiments, adder tree 400 does not include the second layer of adders ADD2, and thereby includes a total of u=2 layers such that, in operation, summation data element SDm is generated based on a total of U=4 sum data elements SUM11-SUM1U.

In some embodiments, adder tree 400 thereby includes a total number of layers ranging from 2 to 9. In some embodiments, adder tree 400 thereby includes the total number of layers ranging from 4 to 7.

Adder tree 400 is thereby configured to be capable of performing the operations discussed above with respect to adder tree 122 and FIGS. 1A and 1B. By including adder tree 400 as adder tree 122, each memory circuit 100A and 100B is capable of realizing the benefits discussed above.

Figure 5:
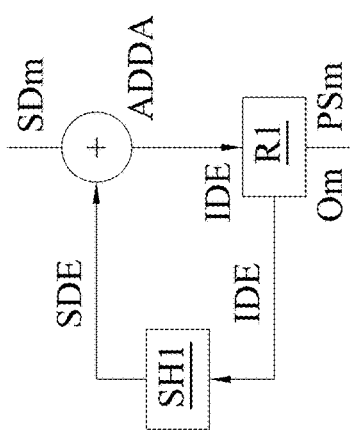
FIG. 5 is a diagram of an accumulator, in accordance with some embodiments.

FIG. 5 is a diagram of accumulator 500, in accordance with some embodiments. Accumulator 500, also referred to as partial sum circuit 500 in some embodiments, is usable as accumulator 140 discussed above with respect to FIGS. 1A and 1B. Accumulator 500 includes adder ADDA coupled to each of data register R1 and shifter SH1. Shifter SH1 is also coupled to data register R1 such that adder ADDA, data register R1, and shifter SH1 are thereby collectively coupled in a feedback arrangement.

Adder ADDA is configured to, in operation, receive summation data element SDm, discussed above with respect to FIG. 4. In some embodiments, e.g., those in which accumulator 500 is used as accumulator 140, summation data element SDm corresponds to one of summation data elements SD1-SDM discussed above with respect to FIGS. 1A and 1B.

Adder ADDA is further configured to, in operation, receive a shifted data element SDE output from shifter SH1, and generate an internal sum data element IDE based on shifted data element SDE and summation data element SDm. Data register R1 is configured to receive internal sum data element IDE from adder ADDA, store internal sum data element IDE, and output stored internal sum data element IDE to shifter SH1 and to an output port Om. Shifter SH1 is configured to receive stored internal data element IDE output from data register R1, and generate shifted data element SDE by shifting stored internal data element IDE by one bit in either an MSB direction or an LSB direction.

Accumulator 500 is thereby configured to, responsive to one or more control signals CTRL received on control signal bus CTRLB (not shown in FIG. 5), perform an accumulation operation whereby stored internal sum data element IDE is increased as each one in a sequence of summation data elements SDm is received. Execution of the accumulation operation over a plurality of instances of the summation data element SDm thereby causes internal data element IDE stored in data register R1 to be output on output port Om as a partial sum PSm of the plurality of instances of the summation data element SDm.

In some embodiments, e.g., those in which accumulator 500 is used as accumulator 140, partial sum PSm output on output port Om corresponds to one of partial sums PS1-PSM output on the corresponding output port O1-OM discussed above with respect to FIGS. 1A and 1B.

Accumulator 500 is thereby configured to be capable of performing the operations discussed above with respect to accumulator 140 and FIGS. 1A and 1B. By including accumulator 500 as accumulator 140, each memory circuit 100A and 100B is capable of realizing the benefits discussed above.

Figure 6:
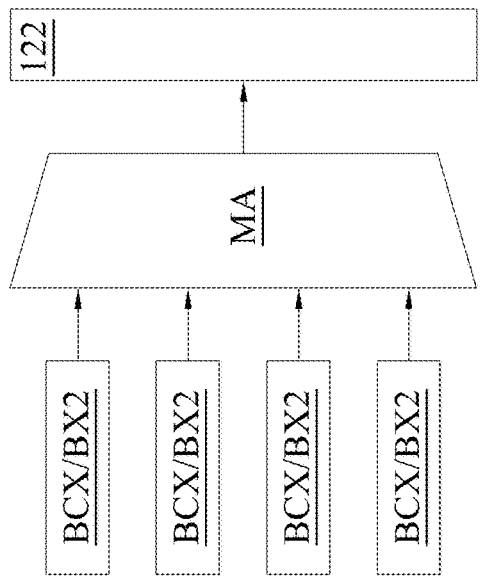
FIG. 6 is a diagram of a portion of a memory array, in accordance with some embodiments.

FIG. 6 is a diagram of a portion of a memory array 120A or 120B (120A/120B), in accordance with some embodiments. FIG. 6 includes multiple instances of memory cells BCX or BX2 (BCX/BX2) and an instance of adder tree 122, each discussed above with respect to FIGS. 1A and 1B. In the embodiment depicted in FIG. 6, memory array 120A/120B also includes a multiplexer MA coupled between memory cells BCX/BX2 and adder tree 122. FIG. 6 is simplified for the purpose of illustration.

Multiplexer MA is configured to selectively couple one or more of memory cells BCX/BX2 to adder tree 122 such that, in operation, data elements output from memory cells BCX/BX2, e.g., product data elements P11-PMN or sum data elements S11-SML discussed above with respect to FIGS. 1A and 1B, are selectively propagated to adder tree 122 responsive to one or more control signals CTRL received on control signal bus CTRLB (not shown in FIG. 6). In various embodiments, memory cells BCX/BX2 are included in a same column C1-CM or are included in separate columns C1-CM, adder tree 122 thereby being shared between two columns C1-CM.

By the configuration discussed above, a memory circuit 100A or 100B includes memory array 120A/120B including at least one adder tree 122 shared between multiple memory cells BCX/BX2. In such embodiments, the memory circuit 100A or 100B is thereby capable of generating partial sums using smaller areas compared to approaches in which a memory array does not include at least one adder tree shared between multiple memory cells.

Figure 7A:
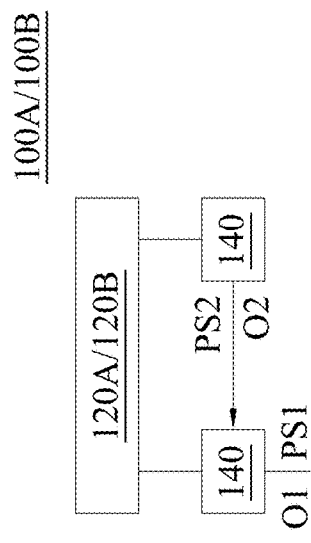
FIGS. 7A and 7B are diagrams of portions of a memory circuit, in accordance with some embodiments.
Figure 7B:
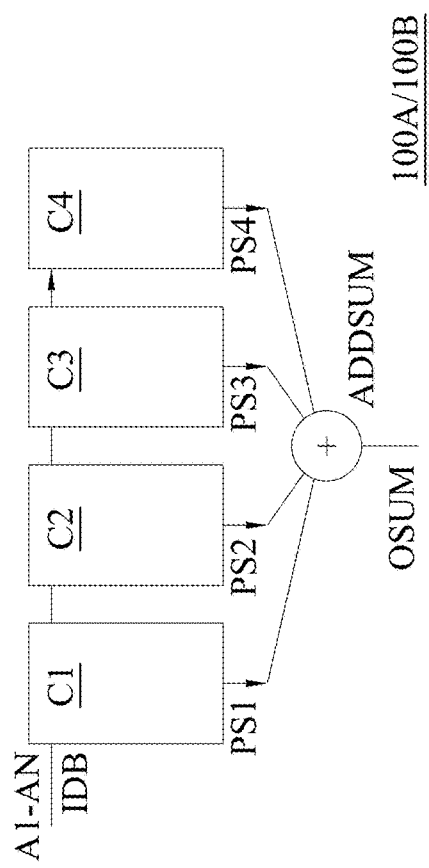

FIGS. 7A and 7B are diagrams of portions of a memory circuit 100A or 100B (100A/100B), in accordance with some embodiments. Each of FIGS. 7A and 7B depicts a non-limiting example in which two or more partial sums PS1-PSM are combined, and is simplified for the purpose of illustration.

In the embodiment depicted in FIG. 7A, memory circuit 100A/100B includes corresponding memory array 120A/120B and two instances of accumulator 140, each discussed above with respect to FIGS. 1A and 1B. In the embodiment depicted in FIG. 7A, output port O2 of a first instance of accumulator 140 is coupled to the second instance of accumulator 140 such that, in operation, partial sum PS2 is received by the second instance of accumulator 140 and included in partial sum PS1 output on output port O1. In some embodiments, the two instances of accumulator 140 are configured to, in operation, selectively output partial sums PS1 and PS2 without including partial sum PS2 in partial sum PS1, e.g., responsive to one or more of control signals CTRL received on control signal bus CTRLB (not shown in FIG. 7A or 7B).

In the embodiment depicted in FIG. 7B, memory circuit 100A/100B includes each of columns C1-C4 (including corresponding instances of accumulator 140) configured to, in operation, receive input data elements A1-AN on input data bus IDB and output corresponding partial sums PS1-PS4, as discussed above with respect to FIGS. 1A and 1B. In the embodiment depicted in FIG. 7B, memory circuit 100A/100B also includes an adder ADDSUM configured to, in operation, receive each partial sum PS1-PS4, and generate a combined partial sum OSUM based on each partial sum PS1-PS4. In some embodiments, memory circuit 100A/100B is configured to, in operation, selectively output partial sums PS1-PS4 without outputting partial sum OSUM, e.g., responsive to one or more of control signals CTRL received on control signal bus CTRLB.

In each of the non-limiting examples depicted in FIGS. 7A and 7B, in operation, a partial sum PS1 or OSUM output from memory circuit 100A/100B is based on each input data element A1-AN being combined with memory cells BCX/BX2 in two or more of columns C1-CM. The partial sum PS1 or OSUM is thereby generated based on the combined bits of weight data elements stored in the memory cells BCX/BX2 such that the resolution, or precision, of the partial sum PS1 or OSUM is increased compared to embodiments in which partial sums PS1-PSM are based on input data elements A1-AN combined with a single one of columns C1-CM.

In some embodiments, memory cells BCX/BX2 include weight data elements including a total of four bits such that, in operation, in the embodiment depicted in FIG. 7A, partial sum PS1 is output based on a total of eight bits of weight data elements, and in the embodiment depicted in FIG. 7B, partial sum OSUM is output based on a total of sixteen bits of weight data elements.

The embodiments depicted in FIGS. 7A and 7B are non-limiting examples provided for the purpose of illustration. In various embodiments, a memory circuit 100A/100B is otherwise configured so as to generate one or more partial sums based on combined stored weight data elements, thereby increasing resolution compared to embodiments in which partial sums are not based on combined weight data elements.

Figure 8:
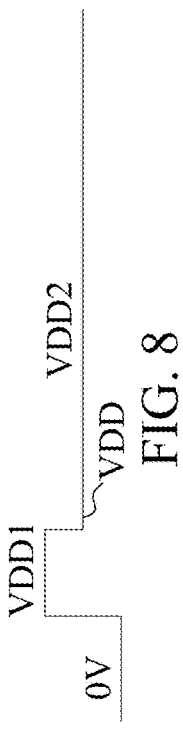
FIG. 8 is a diagram of a memory circuit operating voltage, in accordance with some embodiments.

FIG. 8 is a diagram of a memory circuit operating voltage VDD, in accordance with some embodiments. In the embodiment depicted in FIG. 8, operating voltage VDD is a power supply voltage of a power domain within which memory circuit 100A or 100B operates, as discussed above with respect to FIGS. 1A and 1B. Operating voltage VDD includes three power supply voltage levels, 0V, VDD1, and VDD2, in which power supply voltage level VDD1 is greater than power supply voltage level VDD2. The voltage levels and timing relationships depicted in FIG. 8, e.g. relative durations and/or magnitudes, and sequences, are non-limiting examples provided for the purpose of illustration.

Power supply voltage level 0V represents a powered down mode, in which memory circuit operations are not performed. In some embodiments, memory array 120A or 120B includes storage units SU1, and SU2 if present, including non-volatile memory cells such that weight data elements WTmn and/or WTm(n+1) are retained throughout one or more periods during which operating voltage VDD has voltage level 0V.

Power supply voltage level VDD1 represents an I/O mode, during which one or more weight elements WTmn and or WTm(n+1) are stored in memory cells BCX and/or BX2 in one or more write operations and/or accessed in one or more read operations.

Power supply voltage level VDD2 represents a computation mode, during which one or more in-memory computation operations are performed as discussed above with respect to FIGS. 1A and 1B and/or as discussed below with respect to methods 900 and 1000.

In the embodiment depicted in FIG. 8, by performing in-memory computations at power supply voltage level VDD2 less than power supply voltage level VDD1, power usage is decreased compared to approaches in which in-memory computations are performed in a computation mode having a same voltage level as that of an I/O mode.

Figure 9:
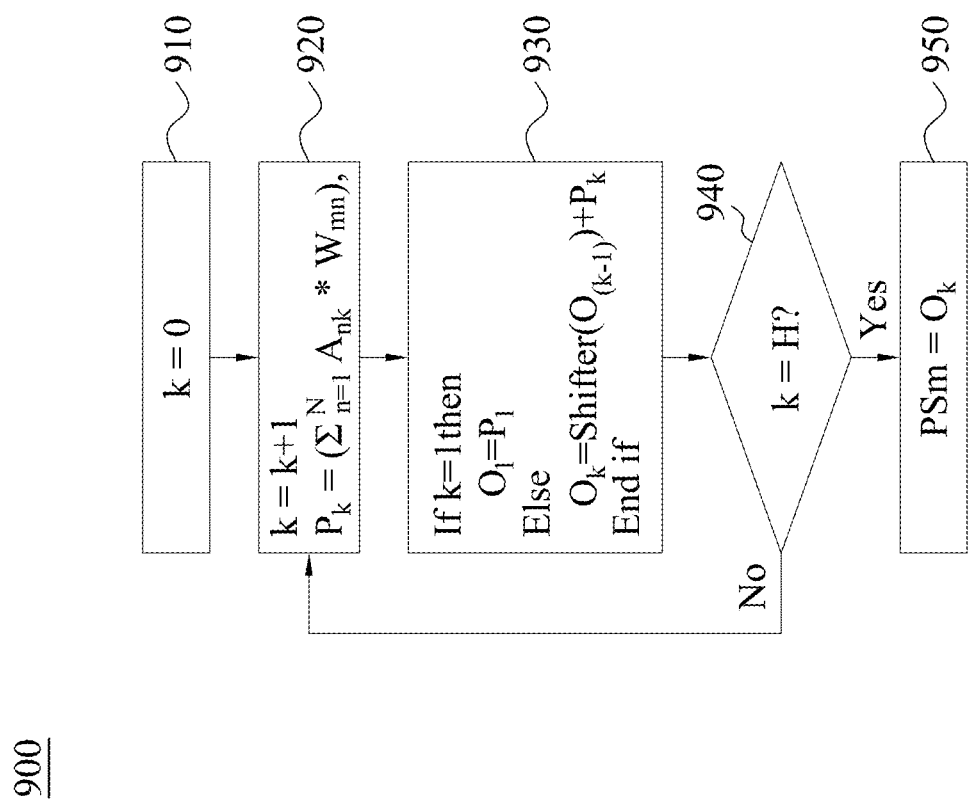
FIG. 9 is a flowchart of a method of operating a memory circuit, in accordance with some embodiments.

FIG. 9 is a flowchart of method 900 of operating a memory circuit, in accordance with some embodiments. Method 900 is usable with a memory circuit, e.g., memory circuit 100A or 100B discussed above with respect to FIGS. 1A and 1B.

The sequence in which the operations of method 900 are depicted in FIG. 9 is for illustration only; the operations of method 900 are capable of being executed simultaneously or in sequences that differ from that depicted in FIG. 9. In some embodiments, operations in addition to those depicted in FIG. 9 are performed before, between, during, and/or after the operations depicted in FIG. 9. In some embodiments, the operations of method 900 are a subset of a method of operating an IC, e.g., a sensor, RF device, processor, logic, or signal processing circuit, or the like. In various embodiments, one or more operations of method 900 are a subset of method 1000 discussed below with respect to FIG. 10.

Method 900 is a non-limiting example of a partial sum calculation in which an instance PSm of partial sums PS1-PSM is calculated for a corresponding mth one of columns C1-CM, as discussed above with respect to FIGS. 1A-5. In the embodiment depicted in FIG. 9, counter k is cycled through each of the number H bits of each input data element A1-AN. At each value of counter k, a summation data element $P_k$, corresponding to an instance of summation data elements SD1-SDM, is calculated as a sum of N products of the corresponding kth bits and weight data elements Wmn. Partial sum PSm is generated by accumulating data elements $P_k$ as discussed below.

At operation 910, counter k is initialized to zero. In some embodiments, initializing counter k includes using control circuit 150 discussed above with respect to FIGS. 1A-5.

In some embodiments, initializing counter k to zero includes setting the contents of one or more data registers to zero. In some embodiments, initializing counter k to zero includes setting internal data element IDE of a data register R1 to zero, as discussed above with respect to accumulator 500 and FIG. 5.

At operation 920, counter k is increased by one, and summation data element $P_k$ is generated based on the value of counter k. Generating summation data element $P_k$ includes summing product data elements corresponding to each of N rows of data in memory array 120A or 120B over the range defined from n=1 to N. Each nth product data element is the kth bit Ank of the input data element An corresponding to counters n and k, multiplied with a corresponding weight data element Wmn or Wm(n+1). Summing the resultant product data elements over the range n=1 through N thereby generates summation data element $P_k$ corresponding to an instance of summation data elements SD1-SDM.

In some embodiments, generating summation data element Pk includes using an adder tree 122 corresponding to the mth one of columns C1-CM to sum product data elements Pmn output by memory cells BCX over the range n=1 to n=N, as discussed above with respect to memory circuit 100A and FIGS. 1A-5. In some embodiments, generating summation data element Pk includes using memory cells BX2 to generate sum data elements Sml-Sml over the range l=1 to l=L, and using an adder tree 122 corresponding to the mth one of columns C1-CM to sum the sum product data elements Sml-Sml output by the memory cells BX2, as discussed above with respect to memory circuit 100B and FIGS. 1A-5.

At operation 930, partial sum data element $O_k$ is generated based on the value of the counter k. Generating partial sum data element $O_k$ includes initializing partial sum data element $O_k$ to a first value of summation data element $P_k$ when counter k has the value 1, and when counter k has a value other than 1, shifting the previous value of data element $O_k$ ($O_k-1$) and adding a current value of summation data element $P_k$.

Shifting the previous value of partial sum data element $O_k$ corresponds to increasing or decreasing the previous value by a significant bit. In some embodiments, incrementing counter k from 1 to H corresponds to increasing significant bits of input data elements A1-AN, and shifting the previous value of partial sum data element $O_k$ corresponds to increasing the previous value by one significant bit, i.e., multiplying the previous value by two. In some embodiments, incrementing counter k from 1 to H corresponds to decreasing significant bits of input data elements A1-AN, and shifting the previous value of partial sum data element $O_k$ corresponds to decreasing the previous value by one significant bit, i.e., dividing the previous value by two.

In some embodiments, generating partial sum data element $O_k$ includes setting partial sum data element PS1-PSM to a first instance of the corresponding summation data element SD1-SDM by storing the first instance of the corresponding summation data element SD1-SDM as internal data element IDE in data register R1, using shifter SH1 to shift internal data element IDE, and adding subsequent instances of summation data elements SD1-SDM to shifter data elements SDE as discussed above with respect to FIGS. 1A-5.

At operation 940, counter k is compared to the number H. If counter k is less than the number H, method 900 returns to operation 920, and if counter k is equal to the number H, method 900 continues to operation 950.

At operation 950, partial sum data element PSm is set to the final value of partial sum data element $O_k$ corresponding to counter k=H. In some embodiments, the number H=4, incrementing counter k corresponds to increasing significant bits of input data elements A1-AN, and setting partial sum data element PSm to the final value of partial sum data element $O_k$ is given by $PSm = 2^0 \sum_{n=1}^{N} An1 \times Wmn + 2^1 \sum_{n=1}^{N} An2 \times Wmn + 2^2 \sum_{n=1}^{N} An3 \times Wmn + 2^3 \sum_{n=1}^{N} An4 \times Wmn$ wherein counter k=1 corresponds to an LSB and a coefficient of $2^0$, and counter k=4 corresponds to an MSB and a coefficient of $2^3$.

In some embodiments, setting partial sum data element PSm to the final value of partial sum data element $O_k$ includes outputting the mth partial sum data element PS1-PSM on a corresponding mth output port O1-OM, as discussed above with respect to FIGS. 1A-5.

By executing some or all of the operations of method 900 using a memory circuit 100A or 100B, a partial sum is generated based on an in-memory computation, thereby realizing the benefits discussed above with respect to memory circuits 100A and 100B.

Figure 10:
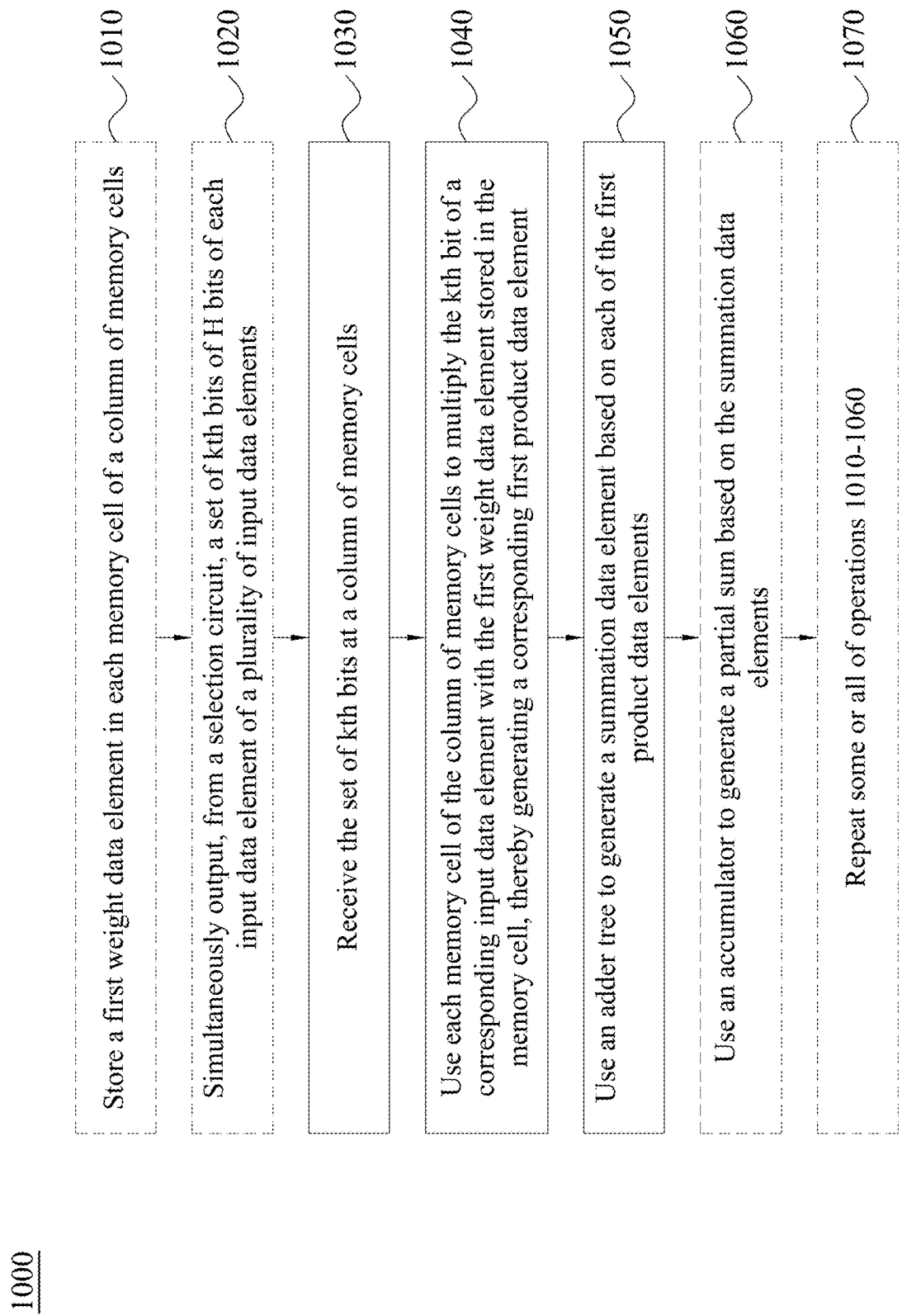
FIG. 10 is a flowchart of a method of operating a memory circuit, in accordance with some embodiments.

FIG. 10 is a flowchart of method 1000 of operating a memory circuit, in accordance with some embodiments. Method 1000 is usable with a memory circuit, e.g., memory circuit 100A or 100B discussed above with respect to FIGS. 1A and 1B.

The sequence in which the operations of method 1000 are depicted in FIG. 10 is for illustration only; the operations of method 1000 are capable of being executed in sequences that differ from that depicted in FIG. 10. In some embodiments, operations in addition to those depicted in FIG. 10 are performed before, between, during, and/or after the operations depicted in FIG. 10. In some embodiments, the operations of method 1000 are a subset of a method of operating an IC, e.g., a sensor, RF device, processor, logic, or signal processing circuit, or the like. In some embodiments, the operations of method 1000 are a subset of a method of operating a CNN or other neural network.

At operation 1010, in some embodiments, a first weight data element is stored in each memory cell of a column of memory cells. In some embodiments, storing the first weight data element in each memory cell of the column of memory cells includes storing weight data in a plurality of columns of memory cells. In various embodiments, storing the first weight data element in each memory cell of the column of memory cells includes using I/O circuit 130 to store weight data elements WTmn and/or WTm(n+1) in memory cells BCX or BX2 of columns C1-CM as discussed above with respect to FIGS. 1A-5.

In some embodiments, storing the first weight data element in each memory cell of the column of memory cells includes operating the memory circuit at a first power supply voltage level greater than a second power supply voltage level at which some or all of operations 1020-1070 are performed. In some embodiments, operating the memory circuit at the first power supply voltage level includes operating the memory circuit at power supply voltage level VDD1, and operating the memory circuit at the second power supply voltage level includes operating the memory circuit at power supply voltage level VDD2 as discussed above with respect to FIG. 8.

At operation 1020, in some embodiments, a set of kth bits of H bits of each input data element of a plurality of input data elements is simultaneously output from a selection circuit. In some embodiments, simultaneously outputting the set of kth bits of H bits of each input data element of the plurality of input data elements includes outputting a set of kth bits A1k-ANk of input data elements A1-AN from selection circuit 110 as discussed above with respect to FIGS. 1A-5.

In various embodiments, simultaneously outputting the set of kth bits of H bits of each input data element of the plurality of input data elements is part of sequentially outputting sets of kth bits by incrementing from an LSB to an MSB or from an MSB to an LSB.

In some embodiments, simultaneously outputting the set of kth bits of each input data element of the plurality of input data elements includes receiving the plurality of input data elements at the selection circuit. In some embodiments, simultaneously outputting the set of kth bits of each input data element of the plurality of input data elements includes storing the plurality of input data elements in the selection circuit, e.g., in one or more data registers. In some embodiments, simultaneously outputting the set of kth bits of each input data element of the plurality of input data elements includes receiving and storing input data elements A1-AN using selection circuit 110 discussed above with respect to FIGS. 1A and 1B. In some embodiments, simultaneously outputting the set of kth bits of each input data element of the plurality of input data elements includes using selection circuit 200 discussed above with respect to FIG. 2.

In some embodiments, simultaneously outputting the set of kth bits of H bits of each input data element of the plurality of input data elements includes generating and responding to one or more control signals, e.g., one or more control signals CTRL generated by control circuit 150 discussed above with respect to FIGS. 1A-5.

In some embodiments, simultaneously outputting the set of kth bits of H bits of each input data element of the plurality of input data elements includes performing some or all of method 900 discussed below with respect to FIG. 9.

At operation 1030, the set of kth bits is received at a column of memory cells. In various embodiments, receiving the set of kth bits at the column of memory cells includes receiving set of kth bits A1k-ANk at a column of memory cells BCX or BX2 discussed above with respect to FIGS. 1A-5.

In some embodiments, receiving the set of kth bits at the column of memory cells includes receiving the set of kth bits at each column of a plurality of columns. In some embodiments, receiving the set of kth bits at the plurality of columns includes receiving set of kth bits A1k-ANk at each of columns C1-CM discussed above with respect to FIGS. 1A-5.

In some embodiments, receiving the set of kth bits at the column of memory cells includes performing some or all of method 900 discussed below with respect to FIG. 9.

At operation 1040, each memory cell of the column of memory cells is used to multiply the kth bit of a corresponding input data element with the first weight data element stored in the memory cell, thereby generating a corresponding first product data element. In various embodiments, using the memory cell to multiply the kth bit of the corresponding input data element with the first weight data element stored in the memory cell includes using a memory cell BCX or BX2 to multiply kth bit A1k-ANk with the first weight data element as discussed above with respect to FIGS. 1A-5.

In some embodiments, multiplying the kth bit of the corresponding input data element with the first weight data element stored in the memory cell, thereby generating the corresponding first product data element includes multiplying bit Ank with weight data element WTmn, thereby generating product data element Pmn as discussed above with respect to memory cells 300A and 300B and FIGS. 3A and 3B.

In some embodiments, using each memory cell of the column of memory cells to multiply the kth bit of the corresponding input data element of the plurality of data elements with the first weight data element includes using each memory cell of the column of memory cells to multiply the kth bit of another corresponding input data element of the plurality of data elements with a second weight data element stored in the memory cell, thereby generating a second product data element, and adding the first product data element to the second product data element to generate a sum data element.

In some embodiments, multiplying the kth bit of another corresponding input data element of the plurality of data elements with the second weight data element stored in the memory cell, thereby generating the second product data element, and adding the first product data element to the second product data element to generate the sum data element includes multiplying bit A(n+1)k with weight data element WTm(n+1), thereby generating product data element Pm(n+1), and adding product data element Pmn to product data element Pm(n+1) to generate sum data element Sml discussed above with respect to memory cell 300B and FIG. 3B.

In some embodiments, using the column of memory cells to multiply the kth bit of the corresponding input data element with the first weight data element stored in the memory cell includes using a plurality of columns of memory cells, e.g., columns C1-CM discussed above with respect to FIGS. 1A-5, to multiply the kth bit of the corresponding input data element with corresponding first weight data elements of a plurality of first weight data elements.

In some embodiments, using the column of memory cells to multiply the kth bit of the corresponding input data element with the first weight data element stored in the memory cell includes generating and responding to one or more control signals, e.g., one or more control signals CTRL generated by control circuit 150 discussed above with respect to FIGS. 1A-5.

In some embodiments, using the column of memory cells to multiply the kth bit of the corresponding input data element with the first weight data element stored in the memory cell includes performing some or all of method 900 discussed below with respect to FIG. 9.

At operation 1050, an adder tree is used to generate a summation data element based on each of the first product data elements. In some embodiments, using the adder tree to generate the summation data element based on each of the first product data elements includes using adder tree 122 to generate an instance of summation data element SD1-SDM based on product data elements Pmn and/or Pm(n+1) discussed above with respect to FIGS. 1A-5.

In some embodiments, using the adder tree to generate the summation data element includes using adder tree 400 discussed above with respect to FIG. 4.

In some embodiments, using the adder tree to generate the summation data element includes using a plurality of adder trees to generate a plurality of summation data elements, e.g., summation data elements SD1-SDM discussed above with respect to FIGS. 1A-5.

In some embodiments, using the adder tree to generate the summation data element includes receiving the first product data elements at the adder tree. In some embodiments, receiving the first product data elements at the adder tree includes receiving a product data element P11-PMN at an adder tree 122 as discussed above with respect to FIGS. 1A-5.

In some embodiments, using the adder tree to generate the summation data element includes receiving sum data elements at the adder tree. In some embodiments, receiving the sum data elements at the adder tree includes receiving a sum data element S11-SML at an adder tree 122 as discussed above with respect to FIGS. 1A-5.

In some embodiments, using the adder tree to generate the summation data element includes using a multiplexer to couple the adder tree to selected memory cells, e.g., using multiplexer MA discussed above with respect to FIG. 6.

In some embodiments, using the adder tree to generate the summation data element based on each of the first product data elements includes generating and responding to one or more control signals, e.g., one or more control signals CTRL generated by control circuit 150 discussed above with respect to FIGS. 1A-5.

In some embodiments, using the adder tree to generate the summation data element based on each of the first product data elements includes performing some or all of method 900 discussed below with respect to FIG. 9.

At operation 1060, an accumulator is used to generate a partial sum based on the summation data elements. In some embodiments, using the accumulator to generate the partial sum based on the summation data elements includes using accumulator 140 to generate a partial sum PS1-PSM based on a corresponding summation data element SD1-SDM as discussed above with respect to FIGS. 1A-5.

In some embodiments, using the accumulator to generate the partial sum includes adding a first summation data element to a second summation data element stored in a data register and shifted by a shifter. In some embodiments, adding the first summation data element to the second summation data element is synchronized to the selection circuit sequentially outputting the sets of kth bits. In some embodiments, using the accumulator to generate the partial sum includes using accumulator 500 to generate partial sum PSm as discussed above with respect to FIG. 5.

In some embodiments, using the accumulator to generate the partial sum based on the summation data elements includes using a plurality of accumulators to generate a plurality of partial sum data elements, e.g., partial sum data elements PS1-PSM discussed above with respect to FIGS. 1A-5.

In some embodiments, using the plurality of accumulators to generate the plurality of partial sums includes using a first accumulator to generate a first partial sum based on a second partial sum generated by a second accumulator, e.g., using a first instance of accumulator 140 to generate partial sum PS1 based on partial sum PS2 as discussed above with respect to FIG. 7A.

In some embodiments, using the plurality of accumulators to generate the plurality of partial sums includes using an adder to generate a partial sum based on multiple partial sums generated by multiple accumulators, e.g., using adder ADDSUM to generate partial sum OSUM based on partial sum PS1-PS4 as discussed above with respect to FIG. 7B.

In some embodiments, using the accumulator to generate the partial sum based on the summation data elements includes generating and responding to one or more control signals, e.g., one or more control signals CTRL generated by control circuit 150 discussed above with respect to FIGS. 1A-5.

In some embodiments, using the accumulator to generate the partial sum based on the summation data elements includes performing some or all of method 900 discussed below with respect to FIG. 9.

At operation 1070, in some embodiments, some or all of operations 1010-1060 are repeated. In some embodiments, repeating some or all of operations 1010-1060 includes synchronizing execution of some or all of operations 1010-1060. In some embodiments, repeating some or all of operations 1010-1060 includes incrementing a counter, e.g., counter k discussed above with respect to FIGS. 1A-9. In some embodiments, repeating some or all of operations 1010-1060 includes generating one or more control signals, e.g., using control circuit 150 to generate one or more of control signals CTRL as discussed above with respect to FIGS. 1A-5.

In some embodiments, repeating some or all of operations 1010-1060 includes performing some or all of method 900 discussed above with respect to FIG. 9.

In some embodiments, repeating some or all of operations 1010-1060 includes using an accumulator to generate a partial sum based on H summation data elements, e.g., using accumulator 140 to generate a partial sum PS1-PSM based on H instances of corresponding summation data elements SD1-SDM as discussed above with respect to FIGS. 1A-5.

In some embodiments, repeating some or all of operations 1010-1060 includes sequentially multiplying sets of kth bits output by the selection circuit with corresponding first weight data elements, thereby generating a plurality of first product data elements, e.g., first product data elements Pmn discussed above with respect to FIGS. 3A and 3B.

In some embodiments, repeating some or all of operations 1010-1060 includes sequentially multiplying sets of kth bits output by the selection circuit with corresponding second weight data elements, thereby generating a plurality of second product data elements, e.g., second product data elements Pm(n+1) discussed above with respect to FIG. 3B.

In some embodiments, repeating some or all of operations 1010-1060 includes using the adder tree to generate the H summation data elements based on the plurality of first product data elements and in some embodiments, further based on the plurality of second product data elements.

In some embodiments, the plurality of input data elements is first plurality of input data elements of a set of pluralities of input data elements, and repeating some or all of operations 1010-1060 includes sequentially receiving each plurality of input data elements of the set of pluralities of input data elements, and performing some or all of operations 1010-1060 to generate one or more partial sums based on each plurality of input data elements of the set of pluralities of input data elements and a single plurality of weight data elements.

By executing some or all of the operations of method 1000, a partial sum is generated based on an in-memory computation, thereby realizing the benefits discussed above with respect to memory circuits 100A and 100B. In embodiments in which one or more partial sums are generated based on each plurality of input data elements of a set of pluralities of input data elements and a single plurality of weight data elements, power levels are further reduced compared to approaches in which a single plurality of weight data elements is not reused for multiple in-memory partial sum computations.

In some embodiments, a memory circuit includes a selection circuit configured to receive a plurality of input data elements, each input data element of the plurality of input data elements including a number of bits equal to H, and output a selected set of kth bits of the H bits of each input data element of the plurality of input data elements, a column of memory cells, each memory cell of the column of memory cells including a first storage unit configured to store a first weight data element and a first multiplier configured to generate a first product data element based on the first weight data element and a first kth bit of the selected set of kth bits, and an adder tree configured to generate a summation data element based on each of the first product data elements. In some embodiments, the first weight data element is a multi-bit data element. In some embodiments, each memory cell of the column of memory cells includes a second storage unit configured to store a second weight data element, a second multiplier configured to generate a second product data element based on the second weight data element and a second kth bit of the selected set of kth bits, and an adder configured to generate a sum data element from the first and second product data elements, wherein the adder tree is configured to generate the summation data element based on each of the sum data elements. In some embodiments, the summation data element is one summation data element of H summation data elements, the selection circuit is configured to sequentially output sets of kth bits from a first bit through an Hth bit, the adder tree is configured to generate each of the H summation data elements based on the sequentially output sets of kth bits, and the memory circuit includes an accumulator configured to generate a partial sum based on the H summation data elements. In some embodiments, the memory circuit includes a control circuit configured to generate one or more control signals received by the selection circuit and the accumulator, the memory circuit thereby being configured to generate the partial sum synchronized to the selection circuit sequentially outputting the sets of kth bits. In some embodiments, the column of memory cells is one column of a plurality of columns of memory cells, each column of memory cells being configured to receive the selected set of kth bits of the H bits of each plurality of bits, the adder tree is one adder tree of a plurality of adder trees coupled to corresponding columns of the plurality of columns of memory cells, the accumulator is one accumulator of a plurality of accumulators coupled to corresponding adder trees of the plurality of adder trees, and each accumulator of the plurality of accumulators is configured to generate a corresponding partial sum based on the H summation data elements generated by the corresponding adder tree of the plurality of adder trees. In some embodiments, at least one accumulator of the plurality of accumulators is configured to generate the corresponding partial sum based on a partial sum generated by another accumulator of the plurality of accumulators. In some embodiments, each first storage unit includes an SRAM device configured to store some or all of the first weight data element. In some embodiments, the memory circuit includes an I/O circuit configured to store each first weight data element in the corresponding first storage unit.

In some embodiments, a method of operating a memory circuit includes receiving, at a column of memory cells, a set of kth bits of a number H of bits of each input data element of a plurality of input data elements, using each memory cell of the column of memory cells to multiply the kth bit of a corresponding input data element of the plurality of data elements with a first weight data element stored in the memory cell, thereby generating a corresponding first product data element, and using an adder tree to generate a summation data element based on each of the first product data elements. In some embodiments, using each memory cell of the column of memory cells to multiply the kth bit of the corresponding input data element of the plurality of data elements with the first weight data element includes using each memory cell of the column of memory cells to multiply the kth bit of another corresponding input data element of the plurality of data elements with a second weight data element stored in the memory cell, thereby generating a second product data element, and add the first product data element to the second product data element to generate a sum data element, wherein using the adder tree to generate the summation data element is based on each of the corresponding sum data elements. In some embodiments, the method includes using a selection circuit to sequentially output sets of kth bits of the H bits of each input data element of the plurality of input data elements, and using an accumulator to generate a partial sum based on H summation data elements, wherein using each memory cell of the column of memory cells to multiply the kth bit of the input data element of the plurality of data elements with the first weight data element includes sequentially multiplying each kth bit with the first weight data element, thereby generating a plurality of first product data elements, and using the adder tree to generate the summation data element based on each of the first product data elements includes using the adder tree to generate the H summation data elements based on the plurality of first product data elements. In some embodiments, receiving the kth bit of each input data element of the plurality of input data elements includes receiving the set of kth bits at each column of memory cells of a plurality of columns of memory cells, using each memory cell of the column of memory cells to multiply the kth bit with the first weight data element includes using each memory cell of each column of memory cells of the plurality of columns of memory cells to multiply the kth bit with a corresponding first weight data element stored in the memory cell, thereby generating the corresponding first product data element, using the adder tree to generate the summation data element includes using a plurality of adder trees to generate a plurality of summation data elements based on the first product data elements, and using the accumulator to generate the partial sum includes using a plurality of accumulators to generate a plurality of partial sums based on corresponding H summation data elements. In some embodiments, using the plurality of accumulators to generate the plurality of partial sums includes using a first accumulator to generate a first partial sum based on a second partial sum generated by a second accumulator. In some embodiments, using the accumulator to generate the partial sum includes adding a first summation data element to a second summation data element stored in a data register and shifted by a shifter, and adding the first summation data element to the second summation data element is synchronized to the selection circuit sequentially outputting the kth bits. In some embodiments, using the selection circuit to sequentially output the sets of kth bits of the H bits of each input data element of the plurality of input data elements includes outputting the sets of kth bits from a LSB to a MSB. In some embodiments, the method includes storing the first weight data element in each memory cell of the column of memory cells based on a first power supply voltage level, wherein each of the using each memory cell of the column of memory cells to multiply the kth bit with the first weight data element and the using the adder tree to generate the summation data element is based on a second power supply voltage level below the first power supply voltage level.

In some embodiments, a memory circuit includes a selection circuit configured to, for a plurality of input data elements comprising H bits each, sequentially output selected sets of kth bits to corresponding memory cells of each column of memory cells of a plurality of columns of memory cells, a plurality of adder trees, each adder tree of the plurality of adder trees being coupled to a corresponding column of memory cells of the plurality of columns of memory cells, and a plurality of accumulators, each accumulator of the plurality of accumulators being coupled to a corresponding adder tree of the plurality of adder trees. Each memory cell of each column of memory cells includes a multiplier configured to generate a product data element based on the corresponding kth bit of the selected set of kth bits and a weight data element stored in the memory cell, each adder tree of the plurality of adder trees is configured to generate, for each sequentially output set of kth bits, a summation data element based on each of the product data elements of the corresponding column of memory cells, and each accumulator of the plurality of accumulators is configured to generate a partial sum based on the summation data elements generated by the corresponding adder tree of the plurality of adder trees. In some embodiments, each adder tree of the plurality of adder trees includes a first adder configured to receive first and second sum data elements, and output the summation data elements having a first number of bits, and second and third adders configured to output the first and second sum data elements based on the product data elements of the corresponding column of memory cells, each of the first and second sum data elements having a second number of bits one less than the first number of bits. In some embodiments, at least one adder tree of the plurality of adder trees is coupled to the corresponding column of memory cells of the plurality of columns of memory cells through a multiplexer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   a selection circuit configured to
      receive a plurality of input data elements, each input data element of the plurality of input data elements comprising a number of bits equal to H, and
      output a selected set of kth bits of the H bits of each input data element of the plurality of input data elements;
   a column of memory cells, each memory cell of the column of memory cells comprising:
      a first storage unit configured to store a first weight data element; and
      a first multiplier configured to generate a first product data element based on the first weight data element and a corresponding first kth bit of the selected set of kth bits; and
   an adder tree configured to generate a summation data element based on each of the first product data elements,
   wherein the selection circuit is configured to output each kth bit of the selected set of kth bits to a single memory cell of the column of memory cells.

2. The memory circuit of claim 1, wherein the first weight data element is a multi-bit data element.

3. The memory circuit of claim 1, wherein
   each memory cell of the column of memory cells further comprises:
      a second storage unit configured to store a second weight data element;
      a second multiplier configured to generate a second product data element based on the second weight data element and a corresponding second kth bit of the selected set of kth bits; and an adder configured to generate a sum data element from the first and second product data elements, and
the adder tree is configured to generate the summation data element based on each of the sum data elements.

4. The memory circuit of claim 1, wherein
the summation data element is one summation data element of H summation data elements,
the selection circuit is configured to sequentially output sets of kth bits from a first bit through an Hth bit,
the adder tree is configured to generate each of the H summation data elements based on the sequentially output sets of kth bits, and
the memory circuit further comprises an accumulator configured to generate a partial sum based on the H summation data elements.

5. The memory circuit of claim 4, further comprising a control circuit configured to generate one or more control signals received by the selection circuit and the accumulator, the memory circuit thereby being configured to generate the partial sum synchronized to the selection circuit sequentially outputting the sets of kth bits.

6. The memory circuit of claim 4, wherein
the column of memory cells is one column of a plurality of columns of memory cells, each column of memory cells being configured to receive the selected set of kth bits of the H bits of each plurality of bits,
the selection circuit is configured to output each kth bit of the selected set of kth bits to a single memory cell of each column of the plurality of columns of memory cells,
the adder tree is one adder tree of a plurality of adder trees coupled to corresponding columns of the plurality of columns of memory cells,
the accumulator is one accumulator of a plurality of accumulators coupled to corresponding adder trees of the plurality of adder trees, and
each accumulator of the plurality of accumulators is configured to generate a corresponding partial sum based on the H summation data elements generated by the corresponding adder tree of the plurality of adder trees.

7. The memory circuit of claim 6, wherein at least one accumulator of the plurality of accumulators is configured to generate the corresponding partial sum based on a partial sum generated by another accumulator of the plurality of accumulators.

8. The memory circuit of claim 1, wherein each first storage unit comprises a static random-access memory (SRAM) device configured to store some or all of the first weight data element.

9. The memory circuit of claim 1, further comprising an input/output (I/O) circuit configured to store each first weight data element in the corresponding first storage unit.

10. A method of operating a memory circuit, the method comprising:
receiving, at a column of memory cells, a set of kth bits of a number H of bits of each input data element of a plurality of input data elements;
using each memory cell of the column of memory cells to multiply the kth bit of a corresponding input data element of the plurality of data elements with a first weight data element stored in the memory cell, thereby generating a corresponding first product data element; and
using an adder tree to generate a summation data element based on each of the first product data elements.

11. The method of claim 10, wherein
the using each memory cell of the column of memory cells to multiply the kth bit of the corresponding input data element of the plurality of data elements with the first weight data element comprises using each memory cell of the column of memory cells to:
multiply the kth bit of another corresponding input data element of the plurality of data elements with a second weight data element stored in the memory cell, thereby generating a second product data element; and
add the first product data element to the second product data element to generate a sum data element, and
the using the adder tree to generate the summation data element is based on each of the corresponding sum data elements.

12. The method of claim 10, further comprising:
using a selection circuit to sequentially output sets of kth bits of the H bits of each input data element of the plurality of input data elements; and
using an accumulator to generate a partial sum based on H summation data elements,
wherein
the using each memory cell of the column of memory cells to multiply the kth bit of the corresponding input data element of the plurality of data elements with the first weight data element comprises sequentially multiplying each kth bit with the first weight data element, thereby generating a plurality of first product data elements, and
the using the adder tree to generate the summation data element based on each of the first product data elements comprises using the adder tree to generate the H summation data elements based on the plurality of first product data elements.

13. The method of claim 12, wherein
the receiving the set of kth bits of each input data element of the plurality of input data elements comprises receiving the set of kth bits at each column of memory cells of a plurality of columns of memory cells,
the using each memory cell of the column of memory cells to multiply the kth bit with the first weight data element comprises using each memory cell of each column of memory cells of the plurality of columns of memory cells to multiply the kth bit with a corresponding first weight data element stored in the memory cell, thereby generating the corresponding first product data element,
the using the adder tree to generate the summation data element comprises using a plurality of adder trees to generate a plurality of summation data elements based on the first product data elements, and
the using the accumulator to generate the partial sum comprises using a plurality of accumulators to generate a plurality of partial sums based on corresponding H summation data elements.

14. The method of claim 13, wherein the using the plurality of accumulators to generate the plurality of partial sums comprises using a first accumulator to generate a first partial sum based on a second partial sum generated by a second accumulator.

15. The method of claim 12, wherein
the using the accumulator to generate the partial sum comprises adding a first summation data element to a second summation data element stored in a data register and shifted by a shifter, and the adding the first summation data element to the second summation data element is synchronized to the selection circuit sequentially outputting the sets of kth bits.

16. The method of claim 12, wherein the using the selection circuit to sequentially output the sets of kth bits of the H bits of each input data element of the plurality of input data elements comprises outputting the sets of kth bits from a least significant bit (LSB) to a most significant bit (MSB).

17. The method of claim 10, further comprising:
storing the first weight data element in each memory cell of the column of memory cells based on a first power supply voltage level,
wherein each of the using each memory cell of the column of memory cells to multiply the kth bit with the first weight data element and the using the adder tree to generate the summation data element is based on a second power supply voltage level below the first power supply voltage level.

18. A memory circuit comprising:
a selection circuit configured to, for a plurality of input data elements comprising H bits each, sequentially output selected sets of kth bits to corresponding memory cells of each column of memory cells of a plurality of columns of memory cells, wherein each kth bit of each selected set of kth bits is output to a single memory cell of each column of memory cells of the plurality of columns of memory cells;
a plurality of adder trees, each adder tree of the plurality of adder trees being coupled to a corresponding column of memory cells of the plurality of columns of memory cells; and
a plurality of accumulators, each accumulator of the plurality of accumulators being coupled to a corresponding adder tree of the plurality of adder trees,
wherein
each memory cell of each column of memory cells comprises a multiplier configured to generate a product data element based on the corresponding kth bit of the selected set of kth bits and a weight data element stored in the memory cell,
each adder tree of the plurality of adder trees is configured to generate, for each sequentially output set of kth bits, a summation data element based on each of the product data elements of the corresponding column of memory cells, and
each accumulator of the plurality of accumulators is configured to generate a partial sum based on the summation data elements generated by the corresponding adder tree of the plurality of adder trees.

19. The memory circuit of claim 18, wherein each adder tree of the plurality of adder trees comprises:
a first adder configured to receive first and second sum data elements, and output the summation data elements having a first number of bits; and
second and third adders configured to output the first and second sum data elements based on the product data elements of the corresponding column of memory cells, each of the first and second sum data elements having a second number of bits one less than the first number of bits.

20. The memory circuit of claim 18, wherein at least one adder tree of the plurality of adder trees is coupled to the corresponding column of memory cells of the plurality of columns of memory cells through a multiplexer.

* * * * *